United States Patent
Lee et al.

(10) Patent No.: US 7,576,582 B2
(45) Date of Patent: Aug. 18, 2009

(54) LOW-POWER CLOCK GATING CIRCUIT

(75) Inventors: Dae Woo Lee, Daejeon (KR); Yil Suk Yang, Daejeon (KR); Ik Jae Chun, Daejeon (KR); Chun Gi Lyuh, Daejeon (KR); Tae Moon Roh, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/945,387

(22) Filed: Nov. 27, 2007

(65) Prior Publication Data

US 2008/0129359 A1    Jun. 5, 2008

(30) Foreign Application Priority Data

Dec. 5, 2006   (KR) .................... 10-2006-0122514
Jun. 4, 2007   (KR) .................... 10-2007-0054320

(51) Int. Cl.
   *H03K 3/289* (2006.01)
(52) U.S. Cl. ............... 327/202; 327/203; 327/208; 327/212; 327/218
(58) Field of Classification Search ........... 327/115, 327/116, 117, 118, 355–360, 199–203, 208–215, 327/218, 219, 222; 377/47, 48
See application file for complete search history.

(56) References Cited

U.S. PATENT DOCUMENTS

| 6,204,695 | B1 | 3/2001 | Alfke et al. |
| 6,844,767 | B2 | 1/2005 | Shelor |
| 7,023,240 | B2 | 4/2006 | Elappuparackal |

FOREIGN PATENT DOCUMENTS

| KR | 100294695 B1 | 4/2001 |
| KR | 1020040040732 A | 5/2004 |

*Primary Examiner*—Lincoln Donovan
*Assistant Examiner*—Brandon S Cole
(74) *Attorney, Agent, or Firm*—Ladas & Parry LLP

(57) ABSTRACT

Provided is a low-power clock gating circuit using a Multi-Threshold CMOS (MTCMOS) technique. The low-power clock gating circuit includes a latch circuit of an input stage and an AND gate circuit of an output stage, in which power consumption caused by leakage current in the clock gating circuit is reduced in a sleep mode, and supply of a clock to a unused device of a targeted logic circuit is prevented by the control of a clock enable signal in an active mode, thereby reducing power consumption. The low-power clock gating circuit using an MTCMOS technique uses devices having a low threshold voltage and devices having a high threshold voltage, which makes it possible to implement a high-speed, low-power circuit, unlike a conventional clock gating circuit using a single threshold voltage.

14 Claims, 4 Drawing Sheets

LOW-POWER CLOCK GATING CIRCUIT

CROSS-REFERENCE TO RELATED APPLICATION

This application claims priority to and the benefit of Korean Patent Application No. 2006-122514, filed Dec. 5, 2006, and No. 2007-54320, filed Jun. 4, 2007, the disclosure of which is incorporated herein by reference in its entirety.

BACKGROUND

1. Field of the Invention

The present invention relates to a clock gating circuit capable of blocking a clock supplied in an active mode when a device in a targeted logic circuit does not operate and retaining data without leakage current in a sleep mode, by using a Multi-Threshold CMOS (MTCMOS) technique.

The present invention has been produced from the work supported by the IT R&D program of MIC (Ministry of Information and Communication)/IITA (Institute for Information Technology Advancement) [2006-S-006-01, Components/Module technology for Ubiquitous Terminals] in Korea.

2. Discussion of Related Art

FIG. 1 illustrates a conventional clock gating circuit using a single threshold voltage and including an AND gate 150. A gated clock GCLK is transferred to a flip-flop 200. When an enable signal EN is high, an input clock CP passes through the AND gate 150 and the gated clock GCLK is transferred to the flip-flop 200. When the enable signal EN is low, the gated clock GCLK becomes low irrespective of the input clock CP and the clock is not supplied to the flip-flop 200. Thus, the clock gating circuit has such a simple structure. However, the gated clock GCLK from the clock gating circuit of FIG. 1 may include glitch or spike.

FIG. 2 illustrates a clock gating circuit 160 comprising a latch circuit located at an input of the AND gate 150 to solve the problem associated with the clock gating circuit of FIG. 1, in which a conventional single threshold voltage is used. Here, when a 130 nm transistor operating at 1.2V is used, the single threshold voltage is about 0.34V. The configuration and operation of the conventional clock gating circuit of FIG. 2 will now be described. The clock gating circuit 160 using a single threshold voltage includes a transmission gate 100 that is controlled by a clock signal CP and an inverted clock signal CPb and receives an enable signal EN from a targeted logic gate 170, a feedback transmission gate 140 connected via a second inverter 130 for inverting an output signal of a first inverter 110, and an AND gate 150 for receiving the enable signal from the third inverter 120 via the first inverter 110 and the clock CP and outputting the gated clock GCLK.

The clock signal CP is generated by a clock signal generating circuit (not shown), and the inverted clock signal CPb is an inverted version of the clock signal CP.

Each of the transmission gate 100, the inverters 110, 120 and 130, the feedback transmission gate 140, and the AND gate 150 consists of a PMOS transistor and an NMOS transistor each having a single threshold voltage, i.e., an intermediate threshold voltage (normal Vt), as shown in FIGS. 3a and 3b.

Operation of the clock gating circuit of FIG. 2 will now be described.

When the clock signal CP is high and the inverted clock signal CPb is low, the transmission gate 100 is turned on and the feedback transmission gate 140 is turned off.

In this case, when the enable signal EN is high, the output signal passing through the first inverter 110 and the third inverter 120 becomes high and is input to the AND gate 150. The clock signal CP at a high level is also input to the AND gate 150. Accordingly, the gated clock GCLK becomes high to turn the targeted logic circuit 170 on.

On the other hand, when the enable signal EN is low, the output signal passing through the first inverter 110 and the third inverter 120 becomes low and is input to the AND gate 150. The clock signal CP at a high level is also input to the AND gate 150. Accordingly, the gated clock GCLK becomes low to turn the targeted logic circuit 170 off and block the clock.

When the clock signal CP is low and the inverted clock signal CPb is high, the transmission gate 100 is turned off and the feedback transmission gate 140 is turned on. Accordingly, the clock gating circuit enters a standby state and retains a previous data state in the feedback circuit.

Although a conventional clock gating circuit comprising a single threshold voltage can block the clock when a specific targeted circuit is not active, it is difficult to implement a high-performance and low-power circuit due to leakage current in a scaled-down device.

SUMMARY OF THE INVENTION

The present invention relates to a low-power clock gating circuit using a Multi-Threshold CMOS (MTCMOS) technique. The present invention is directed to a low-power clock gating circuit comprising a latch circuit and an AND gate circuit configured by the MTCMOS technique, in which power consumption caused by leakage current is reduced in a sleep mode, and supply of a clock to a targeted logic circuit is prevented in an active mode.

As described above, a conventional clock gating circuit using single threshold voltage devices cannot both block a clock and reduce power consumption caused by leakage current. To solve this problem, the present invention provides a low-power clock gating circuit including a latch circuit and an AND gate using an MTCMOS technique. The present invention is directed to a clock gating circuit which retains data without leakage current in a sleep mode, reduces power consumption caused by leakage current, and prevents a clock from being supplied to an unused targeted logic circuit in an active mode for reduction of power consumption in the targeted logic circuit.

One aspect of the present invention provides a clock gating circuit including a first inverter, a second inverter, an AND gate, a power terminal, a data terminal, a clock terminal, a sleep control terminal, and an output terminal, the clock gating circuit comprising: PMOS transistors electrically connected between the power terminal and the first inverter, between the power terminal and the second inverter, and between the power terminal and the AND gate and controlled by a sleep control signal applied via the sleep control terminal, each PMOS transistor having a high threshold voltage; and NMOS transistors electrically connected between a ground and the first inverter, between the ground and the second inverter, and between the ground and the AND gate and controlled by the sleep control signal, each NMOS transistor having a high threshold voltage.

Preferably, the sleep control signal comprises a sleep signal and an inverted sleep signal.

Each of the first inverter and the second inverter comprises a PMOS transistor having a low threshold voltage and an NMOS transistor having a low threshold voltage.

The AND gate comprises a PMOS transistor having a low threshold voltage and an NMOS transistor having a low threshold voltage.

The clock gating circuit further comprises a transfer gate connected between the data terminal and the first signal inverting circuit for transferring the data signal input via the data terminal to the first signal inverting circuit under control of a clock signal.

The clock gating circuit further comprises a feedback transfer gate for inverting an output signal of the first signal inverting circuit and transferring the inverted signal back to the first signal inverting circuit under control of the clock signal.

Another aspect of the present invention provides a clock gating circuit comprising: a first signal inverting circuit for inverting a data signal through a first inverter and outputting an inverted signal under control of a sleep control signal; a second signal inverting circuit for inverting the output signal of the first signal inverting circuit through a second inverter and outputting an inverted signal under control of the sleep control signal; and an AND gate circuit for receiving the output signal of the second signal inverting circuit and a clock signal and outputting a gated signal under control of the sleep control signal.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, preferred embodiments of the present invention will be described in detail with reference to the accompanying drawings. The embodiments of the present invention, however, may be changed into several other forms, and the scope of the present invention should not be construed to be limited to the following embodiments. The embodiments of the present invention are intended to more entirely explain the present invention to those skilled in the art.

In general, transistors include transistors having a low threshold voltage and transistors having a high threshold voltage. 130 nm transistors operating at 1.2V have a low threshold voltage of about 0.24V and a high threshold voltage of about 0.44V. In the description below, a signal inverting circuit may be simply referred to as an inverting circuit.

Figure 1:
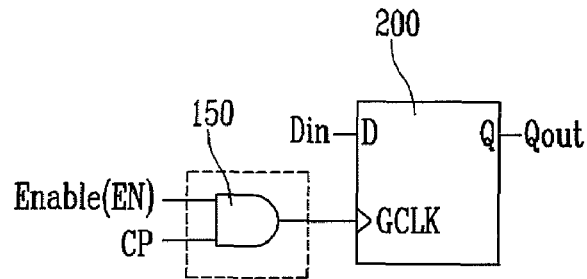
FIG. 1 illustrates a conventional clock gating circuit comprising single threshold voltage devices.
Figure 2:
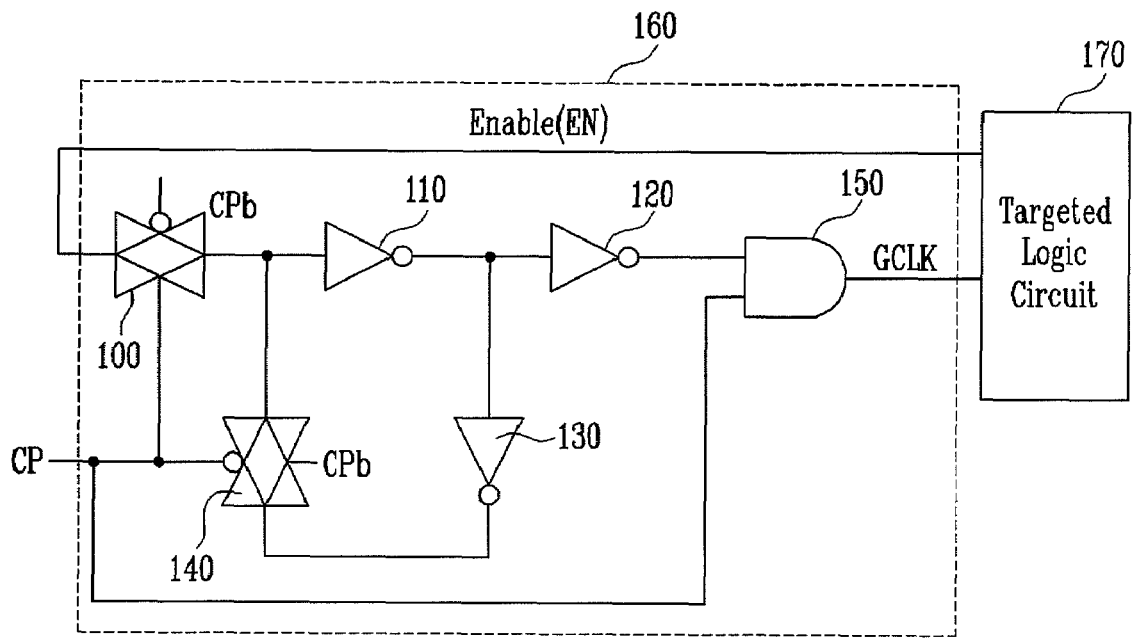
FIG. 2 illustrates another conventional clock gating circuit comprising single threshold voltage devices.
Figure 3A:
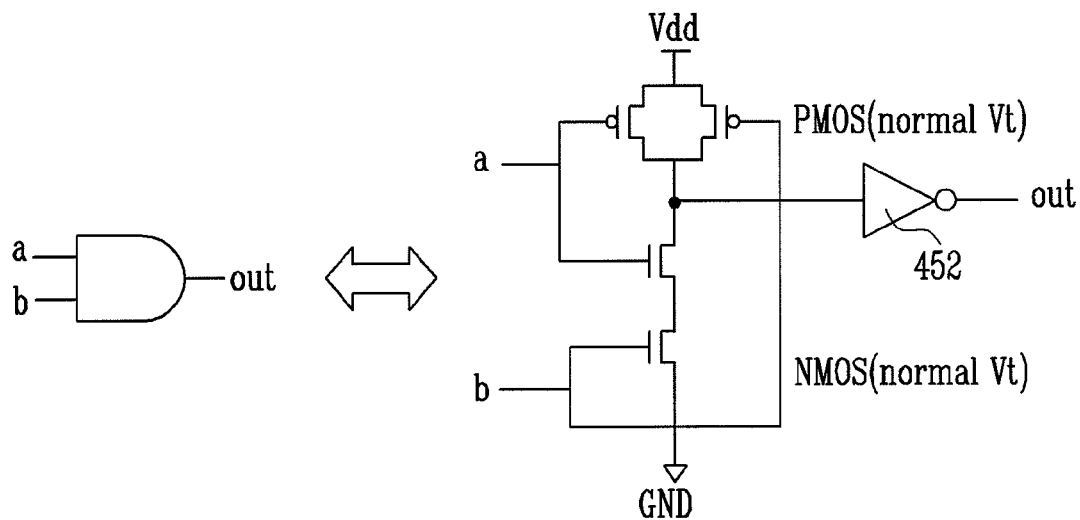
FIG. 3a illustrates a conventional AND gate circuit comprising single threshold voltage devices.
Figure 3B:
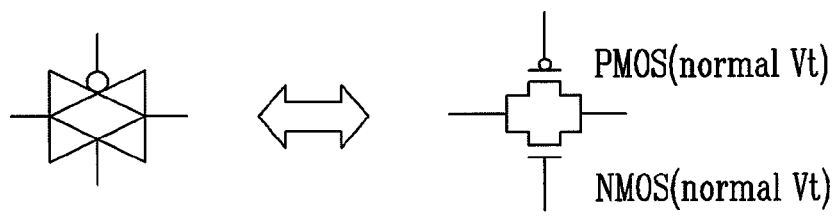
FIG. 3b illustrates a conventional transmission gate circuit comprising single threshold voltage devices.
Figure 4:
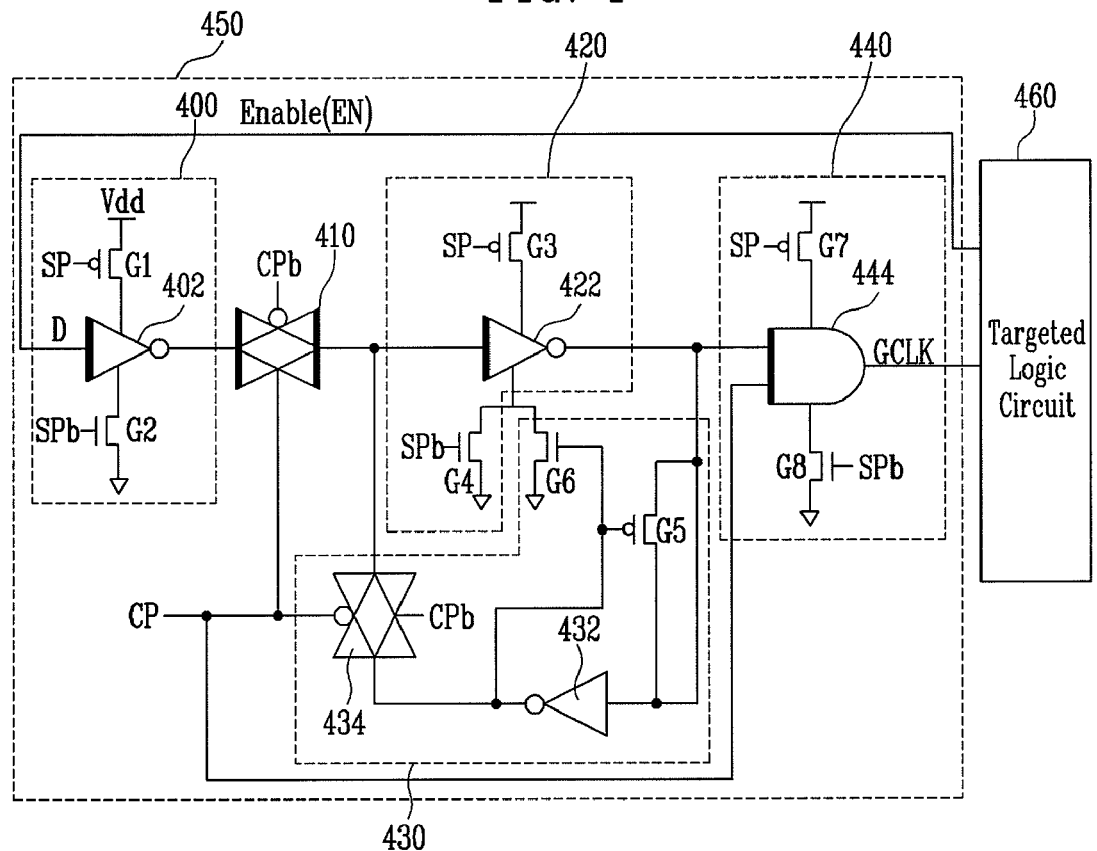
FIG. 4 illustrates an MTCMOS low-power clock gating circuit according to the present invention.
Figure 5A:
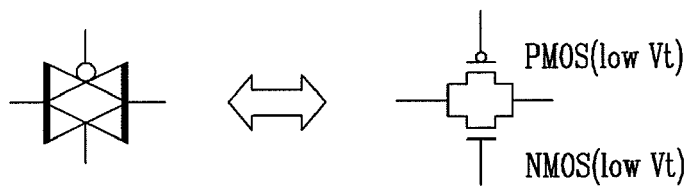
FIG. 5a illustrates a transmission gate circuit comprising low threshold voltage devices according to the present invention.
Figure 5B:
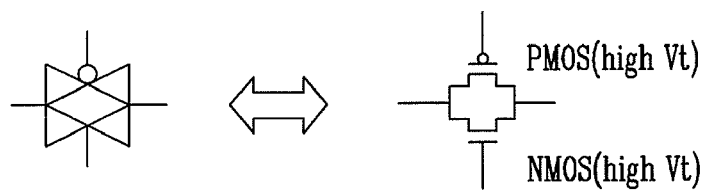
FIG. 5b illustrates a transmission gate circuit comprising high threshold voltage devices according to the present invention.
Figure 6A:
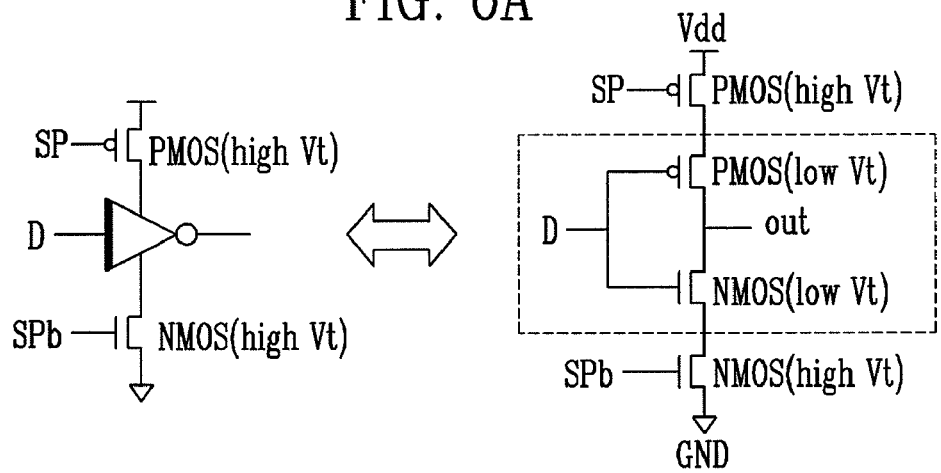
FIGS. 6a to 6c illustrate individual circuits in an MTCMOS clock gating circuit according to the present invention.
Figure 6B:
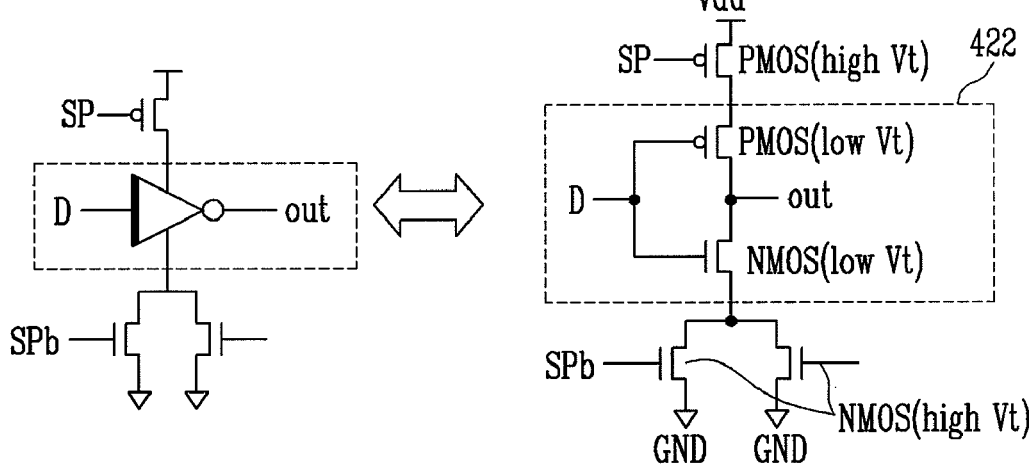
Figure 6C:
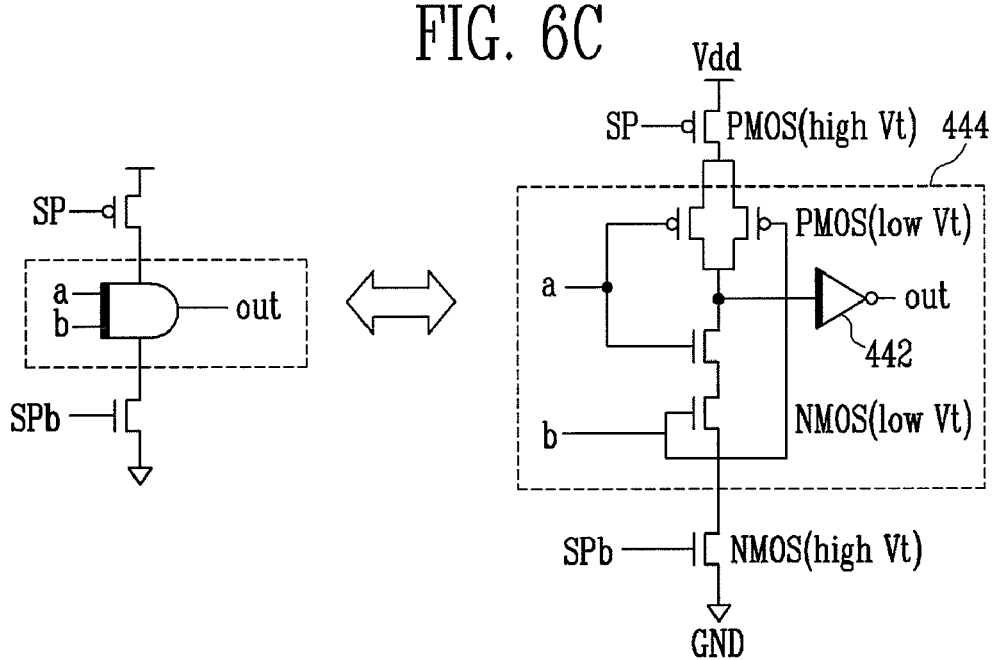

FIG. 4 illustrates a clock gating circuit using an MTCMOS technique according to the present invention, FIG. 5a illustrates a transmission gate circuit comprising low threshold voltage devices according to the present invention, FIG. 5b illustrates a transmission gate circuit comprising high threshold voltage devices according to the present invention, and FIGS. 6a to 6c illustrate individual circuits in an MTCMOS clock gating circuit shown in FIG. 4.

Referring to FIG. 4, the MTCMOS clock gating circuit 450 comprises a first signal inverting circuit 400 including: a first inverter 402 for inverting and outputting an enable signal EN under control of a sleep signal SP and an inverted sleep signal SPb; a transmission gate 410 for transferring an output signal of the first signal inverting circuit 400 under control of a clock signal CP, the transmission gate 410 having an equivalent circuit as shown in FIG. 5a; a second inverter 422 for outputting an enable signal from the transmission gate 410 under control of a sleep control signal SLP; an AND gate 444 for receiving an output signal of the second inverter 422; and a feedback circuit 430 including a feedback transmission gate 434 for feeding back an output signal of the second inverter 422 to retain data in a sleep mode, the feedback transmission gate 434 having an equivalent circuit as shown in FIG. 5b.

The first signal inverting circuit 400 includes: the first inverter 402 for receiving and inverting the enable signal EN; a first PMOS transistor G1 having a source connected to a power terminal, a gate for receiving the sleep signal SP, and a drain connected to the first inverter 402; and a first NMOS transistor G2 having a drain connected to the first inverter 402, a gate for receiving an inverted sleep signal SPb, and a source connected to a ground.

Here, the first inverter 402 consists of a PMOS transistor and an NMOS transistor each having a low threshold voltage, which allows the enable signal to be transferred along the shortest path.

The first signal inverting circuit 400 is represented by an equivalent circuit as shown in FIG. 6a.

Referring to FIG. 6a, the first PMOS transistor G1 and the first NMOS transistor G2 have high threshold voltages, and the first inverter 402 consists of the PMOS transistor and the NMOS transistor each having a low threshold voltage.

The transmission gate 410 transfers the enable signal from the first signal inverting circuit 400 to the second signal inverting circuit 420 under control of the clock signal CP and the inverted clock signal CPb. The transmission gate 410 consists of a PMOS transistor and an NMOS transistor each having a low threshold voltage.

The second signal inverting circuit 420 is represented by an equivalent circuit as shown in FIG. 6b.

Referring to FIG. 6b, the second signal inverting circuit 420 includes: the second inverter 422 for receiving and outputting the output signal of the transmission gate 410 under control of the sleep signal SP and the inverted sleep signal SPb; a second PMOS transistor G3 having a source connected to the power terminal, a gate for receiving the sleep signal SP, and a drain connected to the second inverter 422; and a second NMOS transistor G4 having a drain connected to the second inverter 422, a gate for receiving the inverted sleep signal SPb, and a source connected to a ground.

The second signal inverting circuit 420 has the equivalent circuit as shown in FIG. 6b when the NMOS transistor G6 in FIG. 4 is included. The second PMOS transistor G3 and the second NMOS transistor G4 have high threshold voltages, and the second inverter 422 consists of a PMOS transistor and an NMOS transistor each having a low threshold voltage.

The feedback circuit 430 enables data to be retained when the MTCMOS latch circuit is in a sleep mode. The feedback circuit 430 consists of a PMOS transistor and an NMOS transistor having a high threshold voltage and small leakage current.

The feedback circuit 430 includes: a third inverter 432 for inverting and outputting an output signal of the second signal inverting circuit 420; a third PMOS transistor G5 having a source for receiving the output signal of the second signal inverting circuit 420 and a gate for receiving an output signal of the third inverter 432; a third NMOS transistor G6 having a drain connected to the second inverter 422 of the second signal inverting circuit 420, a gate for receiving an output signal of the third inverter 432, and a source connected to the ground; and a feedback transmission gate 434 for receiving the output signal of the third inverter 432 and transferring the same to the second signal inverting circuit 420 under control of the clock signal CP and the inverted clock signal CPb.

Each of the third inverter 432 and the feedback transmission gate 434 consists of a PMOS transistor and an NMOS transistor each having a high threshold voltage.

The AND gate circuit 440 has an equivalent circuit as shown in FIG. 6c. The AND gate circuit 440 includes the AND gate 444 for receiving the output signal of the second inverter 422 and the clock signal CP and outputting a gated signal GCLK to a targeted logic circuit 460 under control of the sleep signal SP and the inverted sleep signal SPb.

Referring to FIG. 6c, the sleep signal SP and the inverted sleep signal SPb are received at a PMOS transistor and an NMOS transistor each having a high threshold voltage, and the AND gate 444 consists of PMOS transistors and NMOS transistors each having a low threshold voltage.

Operation of the MTCMOS clock gating circuit 450 having the above-described configuration will now be described.

The MTCMOS clock gating circuit operates in an active mode when the sleep signal SP is low and the inverted sleep signal SPb is high and in a sleep mode when the sleep signal SP is high and the inverted sleep signal SPb is low.

First, operation of the MTCMOS clock gating circuit in an active mode will be described.

When the sleep signal SP is low, the first, second and fourth PMOS transistors G1, G3 and G7 and the first, second and fourth NMOS transistors G2, G4 and G8 each having a high threshold voltage are all turned on, and the inverted sleep signal SPb becomes high.

In this state, when the clock signal CP is high, the inverted clock signal CPb becomes low, such that the transmission gate 410 is turned on and the feedback transmission gate 434 is turned off.

Accordingly, the enable signal EN is output via the first signal inverting circuit 400, the transmission gate 410, the second signal inverting circuit 420, and the AND gate circuit 440.

When the sleep signal SP is low, the clock signal CP is low, and the inverted clock signal CPb is high, the transmission gate 410 is turned off and the feedback transmission gate 434 is turned on, such that a previous enable signal EN is output.

Thus, in the active mode, the MTCMOS clock gating circuit continues to output the enable signal EN as the clock signal CP is high/low.

When the clock signal CP is high and, at this time, the enable signal EN from the targeted logic circuit 460 is high, the gated signal GCLK from the AND gate circuit 440 becomes high and this high clock is transferred to the targeted logic circuit. However, when the clock signal CP is high and, at this time, the enable signal EN from the targeted logic circuit 460 is low, the gated signal GCLK from the AND gate circuit 440 becomes low and this low clock is transferred to the targeted logic circuit, thereby preventing the clock from being transferred to a undesired device.

When the clock signal CP is low, the MTCMOS clock gating circuit retains a previous signal in the feedback circuit 430 irrespective of the enable signal EN from the targeted logic circuit 460, and remains in a standby state.

Thus, in the active mode, the MTCMOS clock gating circuit transfers a signal at a high speed because all of the first inverter 402 of the first signal inverting circuit 400, the transmission gate 410, the second inverter 422 of the second signal inverting circuit 420, and the AND gate 444 of the AND gate circuit 440 consist of a PMOS transistor and an NMOS transistor each having a low threshold voltage.

Next, operation of the MTCMOS clock gating circuit in the sleep mode will be described.

When the sleep signal SP is high, the MTCMOS clock gating circuit operates in the sleep mode.

If the sleep signal SP is high, i.e., when the sleep signal SP is high and the inverted sleep signal SPb is low, the first, second and fourth PMOS transistors G1, G3 and G7 and the first, second and fourth NMOS transistors G2, G4 and G8 each having a high threshold voltage are turned off. Accordingly, the enable signal EN is retained in the feedback circuit 430.

That is, if the output of the second inverter 422 is low, a high signal is applied to the gate of the third NMOS transistor G6 via the third inverter 432 to turn the third NMOS transistor G6 on, and also applied to the gate of the third PMOS transistor G5 to turn the third PMOS transistor G5 off.

In this case, when the clock signal CP is low, the feedback transmission gate 434 is turned on, a high signal is applied to the second inverter 422, which outputs a low signal. In this case, the output of the second inverter 422 remains low because it is connected to the ground via the NMOS transistor in the second inverter 422 and the third NMOS transistor G6, as shown in FIG. 6b.

If the output of the second inverter 422 is high, a low signal is applied to the gate of the third NMOS transistor G6 via the third inverter 432 to turn the third NMOS transistor G6 off, such that the second inverter 422 does not operate. The low signal is also applied to the gate of the PMOS transistor G5 via the second inverter 432 to turn the PMOS transistor G5 on, and the output of the second inverter 422 remains high as the source and the drain of the third PMOS transistor G5 are high.

Thus, because the feedback circuit 430 is intended to retain data, it consists of a PMOS transistor and an NMOS transistor having a high threshold voltage and accordingly small leakage current. This allows the feedback circuit 430 to be designed with a minimum size.

According to the present invention, the clock gating circuit using the MTCMOS technique can minimize power consumption caused by leakage current in nano-level devices and contribute to high-speed operation of logic circuits by using low threshold voltage devices. Furthermore, the clock gating circuit prevents the clock from being supplied to an unused device in response to a state signal, thereby reducing power consumption in the targeted logic circuit. The clock gating circuit using the MTCMOS technique according to the present invention may be widely utilized for a bus interface of a slave device in a system having a pipeline bus structure, and may also be applied to mobile devices for considerable reduction of power consumption.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A clock gating circuit including a first inverter, a second inverter, a third inverter, an AND gate, a power terminal, a data terminal, a clock terminal, a sleep control terminal, and an output terminal, the clock gating circuit comprising:
a first PMOS transistor electrically connected between the power terminal and the first inverter, a second PMOS transistor electrically connected between the power terminal and the second inverter, and a third PMOS transistor electrically connected between the power terminal and the AND gate wherein each of the first through third PMOS transistors is controlled by a sleep control signal applied via the sleep control terminal, each PMOS transistor having a high threshold voltage; and
a first NMOS transistor electrically connected between a ground and the first inverter, a second NMOS transistor electrically connected between the ground and the second inverter, and a third NMOS transistor electrically connected between the ground and the AND gate wherein each of the first thorough third NMOS transistors is controlled by the sleep control signal, each NMOS transistor having a high threshold voltage; and
a fourth PMOS transistor electrically connected between the output of the second inverter and the third inverter and having a high threshold voltage; and
a fourth NMOS transistor electrically connected between the ground and the second inverter and having a high threshold voltage,
wherein the first inverter receives and inverts a data signal to output the inverted signal of the first inverter under control of the sleep control signal,
the second inverter for inverting the output signal from the first inverter to output the inverted signal of the second inverter under control of the sleep control signal,
the AND gate circuit for receiving the output signal of the second inverter and a clock signal and outputting a gated signal under control of the sleep control signal, and
the third inverter for inverting and outputting the output signal of the second inverter,
wherein the output signal of the second inverter is inputted to the third inverter for inverting the output signal from the second inverter to output the inverted signal to the second inverter as a feedback signal under control of the clock signal.

2. The circuit of claim 1, wherein the sleep control signal comprises a sleep signal and an inverted sleep signal.

3. The circuit of claim 1, wherein each of the first inverter and the second inverter comprises a PMOS transistor having a low threshold voltage and an NMOS transistor having a low threshold voltage.

4. The circuit of claim 3, wherein the AND gate comprises a PMOS transistor having a low threshold voltage and an NMOS transistor having a low threshold voltage.

5. The circuit of claim 1, further comprising a transmission gate connected between the first inverter and the second inverter for transferring the data signal input via the first inverter to the second inverter under control of the clock signal.

6. The circuit of claim 5, further comprising a feedback transmission gate for inverting the output signal of the second inverter and transferring the inverted signal back to the second inverter under control of the clock signal.

7. A clock gating circuit comprising:
a first signal inverting circuit for inverting a data signal through a first inverter and outputting an inverted signal under control of a sleep control signal;
a second signal inverting circuit for inverting the output signal of the first signal inverting circuit through a second inverter and outputting an inverted signal under control of the sleep control signal;
an AND gate circuit for receiving the output signal of the second signal inverting circuit and a clock signal and outputting a gated signal under control of the sleep control signal; and
a feedback circuit for feeding an output signal of the second signal inverting circuit back to the second signal inverting circuit under control of the clock signal,
wherein the feedback circuit comprises:
a third inverter for inverting and outputting the output signal of the second signal inverting circuit;
a third PMOS transistor having a source for receiving the output signal of the second signal inverting circuit, a gate for receiving an output signal of the third inverter, and a drain connected to the source; and
a third NMOS transistor having a drain connected to the second inverter, a gate for receiving an output signal of the third inverter, and a source connected to the ground,
wherein the third PMOS transistor and the third NMOS transistor have high threshold voltages.

8. The circuit of claim 7, wherein the sleep control signal comprises a sleep signal and an inverted sleep signal.

9. The circuit of claim 8, wherein the first signal inverting circuit comprises:
a first inverter for inverting the data signal input via a data terminal and transferring an inverted signal to the second signal inverting circuit;
a first PMOS transistor having a source connected to a power terminal, a gate for receiving the sleep signal, and a drain connected to the first inverter; and
a first NMOS transistor having a drain connected to the first inverter, a gate for receiving the inverted sleep signal, and a source connected to a ground,
wherein the first PMOS transistor and the first NMOS transistor have high threshold voltages.

10. The circuit of claim 9, wherein the second signal inverting circuit comprises:
the second inverter for inverting the signal from the first signal inverting circuit and transferring an inverted signal to the AND gate circuit;
a second PMOS transistor having a source connected to the power terminal, a gate for receiving the sleep signal, and a drain connected to the second inverter; and
a second NMOS transistor having a drain connected to the second inverter, a gate for receiving the inverted sleep signal, and a source connected to the ground,
wherein the second PMOS transistor and the second NMOS transistor have high threshold voltages.

11. The circuit of claim 10, further comprising a transmission gate for transferring an output signal of the first signal inverting circuit to the second signal inverting circuit under control of the clock signal.

12. The circuit of claim 7, wherein the AND gate circuit comprises:
an AND gate for receiving the output signal of the second signal inverting circuit and the clock signal;
a fourth PMOS transistor having a source connected to the power terminal, a gate for receiving the sleep signal, and a drain connected to the AND gate; and a fourth NMOS transistor having a drain connected to the AND gate, a gate for receiving the inverted sleep signal, and a source connected to the ground, wherein the fourth PMOS transistor and the fourth NMOS transistor have high threshold voltages.

13. The circuit of claim 12, wherein each of the first inverter, the second inverter, and the AND gate comprises a PMOS transistor having a low threshold voltage and an NMOS transistor having a low threshold voltage.

14. The circuit of claim 7, wherein an output of the AND gate circuit is transferred to a targeted logic circuit, and an output of the targeted logic circuit is input as the data signal to the first signal inverting circuit.

* * * * *